SEMICONDUCTIVE SWITCH

Filed June 17, 1959

INVENTOR
I. M. ROSS
BY
Arthur J. Torsiglieri
ATTORNEY 3,078,196

United States Patent Office

Patented Feb. 19, 1963

3,078,196
SEMICONDUCTIVE SWITCH

Ian M. Ross, Summit, N.J., assignor to Bell Telephone Laboratories, Incorporated, New York, N.Y., a corporation of New York Filed June 17, 1959, Ser. No. 820,926
11 Claims. (Cl. 148—33)

Figures 1, 2, 3, 4:
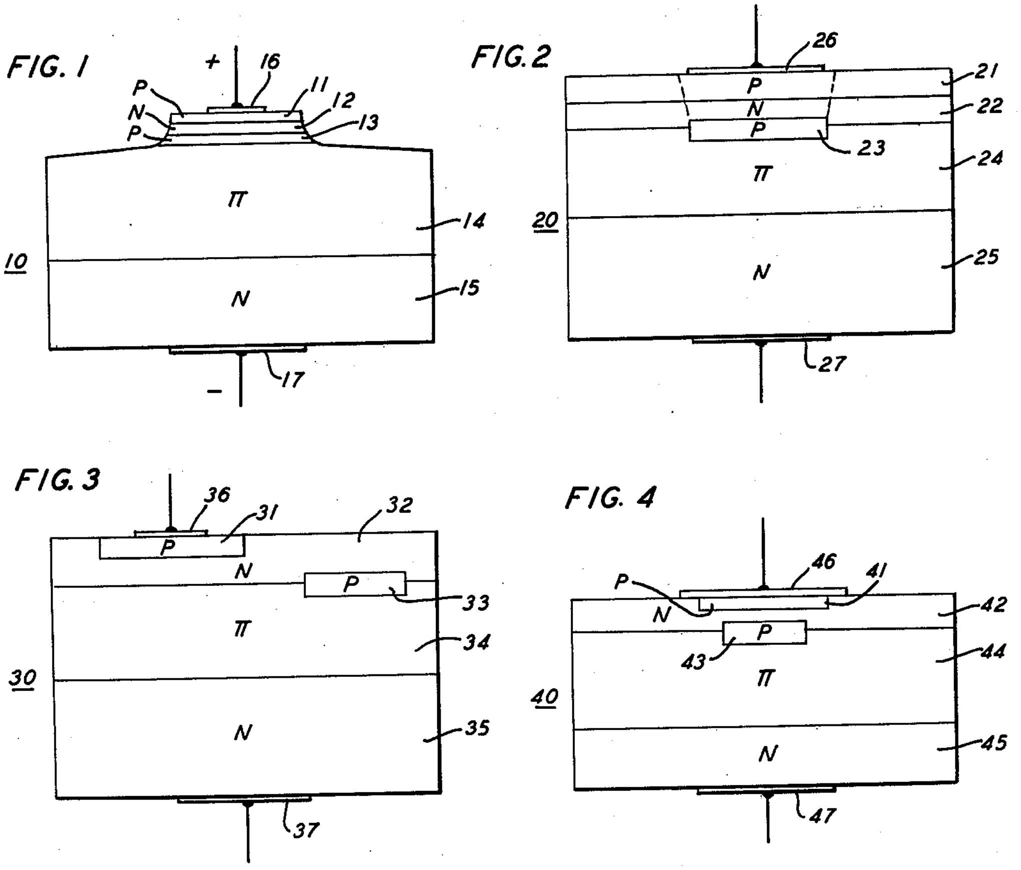

The invention relates to semiconductive devices and more particularly to a device which can be switched rapidly from a high impedance state to a low impedance state by the application of a switching pulse.

The principles of the invention have primary application for improving on the characteristics of four-layer silicon PNPN diodes of the kind disclosed in United States Patent 2,855,524 which issued October 7, 1958, to W. Shockley. Such a diode is designed, in response to applied voltages biasing the middle junction in reverse, to exhibit a high impedance between electrodes connected to its two end zones to voltages below a critical breakdown value, usually related to the breakdown value of the middle junction of the diode. Additionally, such diode is designed to exhibit a low impedance between such electrodes after the applied voltage has exceeded the critical value and to maintain such low impedance state even after the applied voltage decreases below the critical value so long as a relatively low sustaining voltage is maintained between the two electrodes. As is set forth in detail in this patent, this phenomenon is associated with a diode which has an effective alpha whose value is less than unity for a lower range of current therethrough and at least unity for current in excess of this range. Typically, in such a silicon diode the desired variation of alpha with current is the result of the saturation of recombination centers in the silicon.

The principles of the invention also have application in four-layer germanium PNPN diodes where the variation in alpha of the kind described above is achieved by including a relatively wide intermediate zone in which electrical field effects result in an increasing alpha with increasing current level.

One difficulty with diodes of this kind which depend on a variation of alpha with current for switching control is a tendency to exhibit a phenomenon generally described as dynamic breakdown. This phenomenon manifests itself as a breakdown of the high impedance state in response to an applied voltage pulse of amplitude below the design breakdown voltage when the applied voltage pulse has a steep enough wave front.

Analysis of this phenomenon indicates that it is associated with the large capacitive current which tends to flow when the voltage pulse has a steep front. In particular, this phenomenon occurs because a diode of the kind involved is essentially current operated, breakdown occurring when the current attains a sufficiently high value that the effective alpha of the diode exceeds unity. In such a diode, as the capacitance of the middle junction is charged in response to an applied voltage, majority carriers are temporarily added to the two intermediate layers, which gives rise to a current flow. If the applied voltage has a sufficiently steep front and the junction capacitance is sufficiently large, enough capacitive current can flow to cause breakdown.

One object of the invention is a switching diode which has the desirable switching properties described but which is relatively insensitive to dynamic breakdown. Moreover, such diode should, nevertheless, be characterized by a low switching voltage, low turn-on current, low sustaining voltage, and low series resistance in the breakdown state and yet be relatively rugged and easy to handle.

In particular, to this end the invention in its primary aspect relates to a diode which includes a semiconductive wafer having five layers of either PNPΠN or NPNηP configuration where Π and η denote layers which are weakly P-type and N-type, respectively, and in which the Π or η layer is relatively thick in comparison to the other intermediate layers and the NP or PN junction has a surface area relatively small in comparison to the ΠN or ηP junction.

In another aspect, the principles of the invention also have application in providing improved versions of controlled rectifier or thyristor devices which also have utilized four-layer semiconductive wafers but have further included a control electrode to one of the two intermediate layers. In particular, such devices may be improved by substituting for the previously used four-layer wafers the five-layer wafers of the kind being described.

Figure 5:
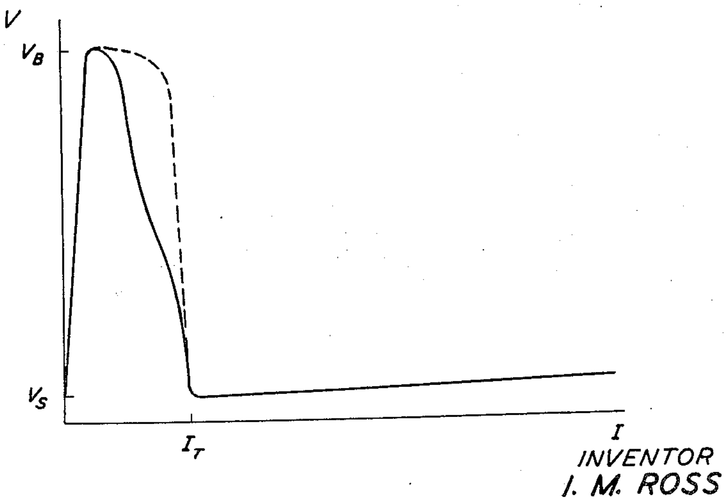

The invention will be better understood from the following more detailed description, taken in conjunction with the accompanying drawing, in which:

Each of FIGS. 1 through 4 shows as a different embodiment of the invention a five-layered PNPΠN wafer; and FIG. 5 shows the voltage-current characteristics of embodiments of the invention.

With reference now to the drawing, the diode 10 shown in FIG. 1 comprises a semiconductive wafer, advantageously monocrystalline silicon, characterized by five successive regions or layers 11, 12, 13, 14 and 15 and electrodes 16 and 17 which make low resistance ohmic connection to end layers 11 and 15, respectively. Layers 11 and 13 are relatively low resistivity P-type. Layers 12 and 15 are relatively low resistivity N-type. Layer 14 is Π-type (relatively high resistivity P-type). In particular, layer 14 should have an average specific resistivity at least several times that of layer 13. As shown, layers 11, 12 and 13 are relatively thin and layers 14 and 15 relatively thick. Of special importance is that layer 14 be thicker, at least several times, than layer 13. Similarly, the junctions between layers 11 and 12, layers 12 and 13 and layers 13 and 14 have a surface area smaller than the junctions between layers 14 and 15. Advantageously, as shown, the NP junction between layers 12 and 13 has an area at least several times smaller than the ΠN junction between layers 14 and 15.

In one specific embodiment, successive layers had thicknesses of about 0.15 mil, 0.15 mil, 0.25 mil, 3.5 mils and 2.5 mils, layers 11, 12 and 13 were about 5 mils square and layers 14 and 15 about 15 mils square.

In use, the diode 10 would be interconnected into a circuit so that switching from a high impedance state to a low impedance state would occur in response to a voltage having the polarity shown.

In FIG. 5, the solid line shows the voltage-current characteristic of a diode of this kind. The breakdown voltage corresponds to $V_B$, the sustaining voltage to $V_S$ and the turn-on or switching current to $I_T$.

The diode can be fabricated by a succession of vapor-solid diffusions utilizing known principles. In particular, a Π-type silicon slice can have one surface subjected to three separate vapor-solid diffusions to form layers 11, 12 and 13 and the other surface subjected to a separate vapor-solid diffusion to form layer 15. The original Π-type material serves to form layer 14. The surface subjected to the three diffusions can be thereafter etched by known principles to form a mesa including the three diffused layers. The electrodes 16 and 17 can be provided in accordance with known principles.

Such a diode makes possible attainment of the objectives of the invention in several different ways.

First, a reduction in area of the middle NP junction which is to be reverse-biased to a size significantly less than the cross section of the bulk portion of the wafer reduces proportionally the capacitance of such junction and, correspondingly, the amount of charge which will flow in response to an applied voltage, and so the likelihood of dynamic breakdown, without detracting appreciably from the ruggedness and ease of handling of the wafer.

Additionally, the current which flows in the intermediate layers as a result of a charging of the capacitance of the reverse-biased middle NP junction is related inversely to the square of the thickness of the intermediate layers. The addition of the relatively thick Π layer effectively increases the thickness of the intermediate layers and correspondingly decreases the amount of steady state current which flows because of the charge released by the capacitance of the NP junction in response to a pulse of steep wave front. As a consequence, the likelihood of dynamic breakdown is further reduced.

However, because the added Π layer is of high specific resistivity, the effective alpha of the diode is little affected because of the low recombination in weakly doped material. As a consequence, the decreased sensitivity to dynamic breakdown is achieved without an undesirable increase in the turn-on current needed to switch the impedance of the diode. This would not have been the case had the added thickness been achieved simply by increasing the thickness of low resistivity layer 13.

Moreover, by providing layers 14 and 15 of relatively large thickness and cross section, there results a diode which is relatively rugged and easy to handle. Additionally, the large cross section of these layers facilitates achieving a low series resistance in the breakdown state without adding significantly to the capacitance of the diode. The layers 11, 12 and 13 being thin also facilitates achieving a low series resistance for the diode.

The layers 12 and 13 being of low specific resistivity makes possible breakdown of the junction therebetween at a low voltage and, consequently, a low switching voltage. This would not have been the case if either layer 12 or 13 had been of high specific resistivity. Their being thin also makes easier achieving a low turn-on current and a low sustaining voltage.

Layers 11 and 15 being of low specific resistivity helps in the attainment of a low series resistance, both directly and by facilitating making low resistive electrode connections.

It can be appreciated that the various ends sought can be furthered a bit more by the inclusion of an $\eta$ layer (high resistivity N) intermediate between P layer 11 and N layer 12, but ordinarily this is unnecessary.

The diode 20 shown in FIG. 2 achieves an NP junction which is relatively smaller in area than the ΠN junction without necessity for etching. The semiconductive crystal includes five layers in succession 21, 22, 23, 24 and 25. Layer 21 is P-type and relatively thin and extends across the entire crystal. Layer 22 is N-type and relatively thin and extends across the entire crystal. Layer 23 is P-type and relatively thin and is localized at only the central portion of the crystal. Layer 24 is Π-type and relatively thick and extends across the whole crystal. Layer 25 is N-type and relatively thick and extends across the entire crystal. In this crystal, too, the area of the NP junction is smaller than the area both of the ΠN junction between layers 24 and 25 and of the PN junction between layers 21 and 22.

Such a crystal may be constructed conveniently by the vapor-solid diffusion method described above if masking is employed to confine to a limited area the first of the three diffusions to one of the surfaces. The broken line shows the extent of such a diffusion.

In this diode, the switching voltage will be determined by the breakdown voltage of the limited area NP junction and, accordingly, it may readily be made conveniently low. The larger area NΠ junction will have a higher breakdown voltage because of its more gradual impurity gradient and so have little effect on the switching voltage. Moreover, the capacitance of the NΠ junction will be relatively small despite its large area for this same reason and so should not add significantly to the capacitance of the NP junction whereby the capacitive charging current in response to a pulse of steep wave front can still be relatively small.

The considerations governing the parameters of the other layers are similar to those discussed for the diode shown in FIG. 1.

FIG. 3 shows a PNPΠN diode 30 comprising five successive layers 31, 32, 33, 34 and 35 and electrodes 36, 37 to end layers 31 and 35, in which the limited area NP junction between layers 32 and 33 does not underlie the limited area PN junction formed between layers 31 and 32.

In this structure breakdown will still occur at the NP junction but the resulting avalanche current will not be enhanced by the alpha of layer 32. As a result, the current-voltage characteristic of the device will exhibit a squarer negative resistance characteristic as shown by the broken line in FIG. 5. This reduces the likelihood of dynamic breakdown since there is required more current for switching at voltages below the breakdown voltage.

FIG. 4 shows a diode 40 which employs a shorting contact the better to control the value of the turn-on current. It includes the five-layered PNPΠN wafer comprising successive layers 41, 42, 43, 44 and 45, respectively, and electrodes 46 and 47. Electrode 47 makes low resistance ohmic connection only to layer 45, whereas electrode 46 makes low resistance ohmic connection both to layers 41 and 42. To facilitate this, the PN junction between layers 41 and 42 is of limited extent. The NP junction between layers 42 and 43 underlies the PN junction and is of lesser extent than it.

In operation, for switching the NP junction is broken down and the avalanche current flows laterally from the center of the layer 42 out to the shorting electrode 46. As a consequence, the effective avalanche current path through the layer 42 to the electrode 46 is longer than it would otherwise be if the NP junction extended fully across the wafer. As a consequence, the effective current path has a higher resistance and the voltage drop associated therewith is higher. This voltage drop provides a corresponding forward bias on the PN junction between layers 41 and 42. As a consequence, the turn-on current needed for switching is reduced.

As previously indicated, the principles of the invention while of primary interest with respect to PNPN silicon diodes are also applicable to other devices. In particular, the principles are applicable to PNPN germanium diodes of the kind that include a wide intermediate layer and utilize electric field effects therein to get the desired increase in alpha with increase in current important to switching diodes of this kind. For example, if any of the diodes which are depicted in FIGS. 1 through 4 was to utilize a germanium crystal instead of silicon, the thickness of the intermediate N-type layer should be increased.

Additionally, the principles of the invention can be extended to thyristors or controlled rectifiers of the kind that result if an additional control electrode be ohmically connected to either the N-type or P-type intermediate layer in the devices shown in FIGS. 1, 2 and 3.

Accordingly, it is to be understood that the specific embodiments described are merely illustrative of the general principles of the invention. Various other embodiments may be devised by a worker in the art without departing from the spirit and scope of the invention. Clearly, for example, an NPN$\eta$P wafer is possible in any of the devices described. Moreover, the specific designs described have been directed at providing a device which can be switched with a small voltage and a low turn-on current and would exhibit in its low impedance state a low sustain-current and a low series impedance. Such characteristics may readily be modified if so desired by the application of known principles consistent with the teaching set forth herein.

What is claimed is:

1. A semiconductive device comprising a semiconductive wafer includnig at least five layers, a first being of a first conductivity type and relatively low specific resistivity, the second being of a second conductivity type and of relatively low specific resistivity, the third being of the first conductivity type and of relatively low specific resistivity, the fourth being of the first conductivity type and of relatively high specific resistivity, and the fifth being of the second conductivity type and of relatively low specific resistivity.

2. The semiconductive device of claim 1 in which the fourth layer is at least several times thicker than the third layer.

3. The semiconductive device of claim 1 in which the area of the rectifying junction between the second and third layers is less than the cross section of the bulk portion of the wafer.

4. A semiconductive device in accordance with claim 1 in which the fourth layer is at least several times thicker than the third layer and the area of the junction between the fourth and fifth layers is at least several times the area of the junction between the second and third layers.

5. A semiconductive device in accordance with claim 1 in which the semiconductive wafer consists of only five layers and electrodes are connected to only the first and fifth layers.

6. The semiconductive device in accordance with claim 1 in which the wafer is monocrystalline silicon and the fourth layer is at least several times thicker than the third layer, the area of the junction between the fourth and fifth layers is at least several times the area of the junction between the second and third layers, and electrodes are connected to only the first and fifth layers.

7. A semiconductive device comprising a semiconductive wafer including five layers in succession of which the first, third and fourth are of one conductivity type and the second and fifth are of the opposite conductivity type, the fourth layer being of higher specific resistivity and thicker than the third layer, the second and fourth layers extending completely across the cross section of the wafer, and the third layer being enclosed between the second and fourth and extending across only a limited portion of the cross section of the wafer.

8. A semiconductive device in accordance with claim 7 further characterized in that the first layer extends across only a limited portion of the cross section of the wafer.

9. A semiconductive device according to claim 8 in which the first layer and the third layer are displaced transversely with respect to one another relative to the axis of the wafer.

10. A semiconductive device comprising a semiconductive wafer having five layers in succession of which the first, third and fourth are of one conductivity type and the second and fifth are of the opposite conductivity type, the fourth layer being thicker and of higher resistivity than the third layer, the junction between the second and third layers being smaller in area than the junction between the first and second layers and the junction between the fourth and fifth layers, a first electrode making low resistance connection to both the first and second layers and the second electrode making low resistance connection to only the fifth layer.

11. A semiconductive device comprising a monocrystalline silicon wafer having five layers in succession, of which the first, third and fourth are of one conductivity type and the second and fifth are of the opposite conductivity type, the fourth layer being thicker and of higher specific resistivity than the first and third layers, the fifth layer being thicker than the second layer, the areas of the junctions between the second and third layers and the third and fourth layers being smaller than the areas of the junctions between the fourth and fifth layers, and electrodes connected to the first and fifth layers.

References Cited in the file of this patent

UNITED STATES PATENTS

| | | |
|---|---|---|
| 2,792,540 | Pfann | May 14, 1957 |
| 2,855,524 | Shockley | Oct. 7, 1958 |
| 2,936,425 | Shockley | May 10, 1960 |
| 2,981,874 | Rutz | Apr. 25, 1961 |

OTHER REFERENCES

Early: The Bell System Technical Journal, No. 3, May 1954, pages 517–533.